(12) United States Patent
Reid

(10) Patent No.: US 7,071,520 B2
(45) Date of Patent: Jul. 4, 2006

(54) MEMS WITH FLEXIBLE PORTIONS MADE OF NOVEL MATERIALS

(75) Inventor: Jason S. Reid, Los Gatos, CA (US)

(73) Assignee: Reflectivity, INC, Sunnyvale, CA (US)

( * ) Notice: Subject to any disclaimer, the term of this patent is extended or adjusted under 35 U.S.C. 154(b) by 243 days.

(21) Appl. No.: 10/176,478

(22) Filed: Jun. 21, 2002

(65) Prior Publication Data

US 2002/0185699 A1   Dec. 12, 2002

Related U.S. Application Data

(63) Continuation-in-part of application No. 09/910,537, filed on Jul. 20, 2001.

(60) Provisional application No. 60/300,533, filed on Jun. 23, 2001, provisional application No. 60/228,007, filed on Aug. 23, 2000.

(51) Int. Cl.
*G01L 1/12* (2006.01)

(52) U.S. Cl. ............... 257/414; 257/252; 257/254; 257/415

(58) Field of Classification Search ............ 257/459, 257/414, 776, 731, 736, 773, 252, 415, 659; 438/52, 459, 53, 455, 619, 951
See application file for complete search history.

(56) References Cited

U.S. PATENT DOCUMENTS 4,904,543 A    2/1990 Sakakima et al.

(Continued)

FOREIGN PATENT DOCUMENTS

EP    1102329 A2    5/2001

OTHER PUBLICATIONS

Linder et al., "Ternary Ta-Si-N Films for Sensors and Actuators", Sensors and Actuators, Sens. Actuators A., Phys. (Switzerland), vol. A61 No. 1-3 (1997), pp. 387-391.*

(Continued)

*Primary Examiner*—Hoai Pham
*Assistant Examiner*—Khanh Duong
(74) *Attorney, Agent, or Firm*—Gregory R. Muir

(57) ABSTRACT

MEMS devices are provided that are capable of movement due to a flexible portion formed of unique materials for this purpose. The MEMS device can have a flexible portion formed of a nitride or oxynitride of at least one transition metal, and formed of a nitride or oxynitride of at least one metalloid or near metalloid; a flexible portion formed of a single transition metal nitride or oxynitride and in the absence of any other metal or metalloid nitrides; a flexible portion formed of one or more late transition metal nitrides or oxynitrides; a flexible portion formed of a single transition metal in nitride form, and an additional metal substantially in elemental form; or a flexible portion formed of at least one metalloid nitride or oxynitride. The MEMS devices can be any device, though preferably one with a flexible portion such as an accelerometer, DC relay or RF switch, optical cross connect or optical switch, or micromirror arrays for direct view and projection displays. The flexible portion (e.g. the hinge of the micromirror) is preferably formed by sputtering a metal and/or metalloid target in nitrogen ambient so as to result in a sputtered hinge. It is also possible to form other parts of the MEMS device (e.g structural parts that do not flex).

30 Claims, 12 Drawing Sheets

U.S. PATENT DOCUMENTS

| | | | |
|---|---|---|---|
| 5,262,000 A | 11/1993 | Welbourne et al. | |
| 5,439,754 A | 8/1995 | Iwasaki et al. | |
| 5,441,597 A | 8/1995 | Bonne et al. | |
| 5,444,173 A * | 8/1995 | Oyama et al. | 585/671 |
| 5,581,436 A | 12/1996 | Summerfelt et al. | |
| 5,612,574 A | 3/1997 | Summerfelt et al. | |
| 5,619,393 A | 4/1997 | Summerfelt et al. | |
| 5,622,893 A | 4/1997 | Summerfelt et al. | |
| 5,656,101 A | 8/1997 | Hayakawa et al. | |
| 5,665,628 A | 9/1997 | Summerfelt | |
| 5,679,980 A | 10/1997 | Summerfelt | |
| 5,696,018 A | 12/1997 | Summerfelt et al. | |
| 5,696,619 A * | 12/1997 | Knipe et al. | 359/224 |
| 5,729,054 A | 3/1998 | Summerfelt et al. | |
| 5,729,074 A | 3/1998 | Shiomi et al. | |
| 5,793,057 A | 8/1998 | Summerfelt | |
| 5,942,054 A | 8/1999 | Tregilgas et al. | |
| 5,994,750 A | 11/1999 | Yagi | |
| 6,020,215 A * | 2/2000 | Yagi et al. | 438/52 |
| 6,024,801 A * | 2/2000 | Wallace et al. | 134/1 |
| 6,090,697 A | 7/2000 | Xing et al. | |
| 6,153,490 A | 11/2000 | Xing et al. | |
| 6,171,970 B1 | 1/2001 | Xing et al. | |
| 6,177,351 B1 | 1/2001 | Beratan et al. | |
| 6,190,802 B1 | 2/2001 | Clerc et al. | |
| 6,238,581 B1 | 5/2001 | Hawkins et al. | |
| 6,316,786 B1 * | 11/2001 | Mueller et al. | 257/40 |
| 6,395,168 B1 * | 5/2002 | Acernese et al. | 210/198.1 |
| 6,436,853 B1 * | 8/2002 | Lin et al. | 438/800 |
| 6,445,106 B1 * | 9/2002 | Ma et al. | 310/309 |
| 6,449,079 B1 * | 9/2002 | Herrmann | 359/214 |
| 6,479,920 B1 * | 11/2002 | Lal et al. | 310/309 |
| 6,522,801 B1 * | 2/2003 | Aksyuk et al. | 385/18 |
| 6,523,961 B1 * | 2/2003 | Ilkov et al. | 353/99 |
| 6,529,310 B1 * | 3/2003 | Huibers et al. | 359/291 |
| 6,614,085 B1 | 9/2003 | Hu | |
| 6,906,846 B1 * | 6/2005 | Cirelli et al. | 359/291 |
| 2001/0008157 A1 | 7/2001 | Bishop et al. | |
| 2001/0040675 A1 * | 11/2001 | True et al. | 355/77 |
| 2002/0057863 A1 * | 5/2002 | Nahum et al. | 385/18 |

OTHER PUBLICATIONS

Brizoual et al., "Experimental Study of Ti-Si-N Films Obtained by Radio Frequency Magnetron Sputtering", Surface and Coatings Technology 116-119 (1999), pp. 922-926.

Cherry et al., Stability of Conducting Amorphous Ru-Si-O Thin Films Under Oxygen Annealing, Microelectronic Engineering 55 (2001), pp. 403-408.

Dubois, P., "Electrostatically Actuated Gas Microvalve Based on a Ta-Si-N Membrane", from the website of The Sensors, Actuators and Microsystems Laboratory at University of Neuchâtel, Switzerland (publication date unknown; accessed and printed Jul. 2, 2001).

Eisenbraun et al., "Low Temperature Inorganic Chemical Vapor Deposition of Ti-Si-N Diffusion Barrier Liners for Gigascale Copper Interconnect Applications", J. Vac. Sci. Technol. B, vol. 18 No. 4 (Jul./Aug. 2000).

Gasser et al., "Reactively Sputtered Ru-Si-O Films", Journal of Applied Physics, vol. 86 No. 4 (Aug. 15, 1999).

Gretillat et al., "Surface-Micromachined Ta-Si-N Beams for Use in Micromechanics", J. Micromech. Microeng., vol. 8 (1998), pp. 88-90.

Hauert et al., "From Alloying to Nanocomposites—Improved Performance of Hard Coatings", Advanced Engineering Materials, vol. 2 No. 5 (2000), pp. 247-259.

He et al., "Letter to the Editor: Bonding Structure and Properties of Ion Enhanced Reactive Magnetron Sputtered Silicon Carbonitride Films", J. Phys.: Condens. Matter, vol. 12 (2000), pp. L591-597.

Herdt et al., "PVD Copper Barrier/Seed Processes: Some Considerations for the 0.15 um Generation and Beyond", Semiconductor Fabtech, 11th Edition (1999), pp. 259-264.

Kim et al., "Nanostructured Ta-Si-N Diffusion Barriers for Cu Metallization", J. Appl. Phys., vol. 82 No. 10 (Nov. 15, 1997), pp. 4847-4851.

Lee et al., "Characterization of Tantalum Nitride Films Deposited by Reactive Sputtering of Ta in N2/Ar Gas Mixtures", Materials Chemistry and Physics, vol. 68 (2001), pp. 266-271.

Linder et al., "Ternary Ta-Si-N Films for Sensors and Actuators", Sens. Actuators A, Phys. (Switzerland), vol. A61 No. 1-3 (1997), pp. 387-391.

Nicolet et al., "Highly Metastable Amorphous or Near-Amorphous Ternary Films (Mictamict Alloys)", Microelectronic Engineering, vol. 55 (2001), pp. 357-367.

Nicolet, M., "Reactively Sputtered Ternary Films of the Type TM-Si-N and their Properties (TM = Early Transition Metal)", Vacuum, vol. 59 (2000), pp. 716-720.

Oizumi et al., "Control of Crystalline Structure and Electrical Properties of TaSiN Thin Film Formed by Reactive RF-Sputtering", Jpn. J. Appl. Phys., vol. 39 (2000), pp. 1291-1294.

Pinnow et al., "Decomposition and Nanocrystallization in Reactively Sputtered Amorphous Ta-Si-N Thin Films", J. Appl. Phys., vol. 90 No. 4 (Aug. 15, 2001), pp. 1986-1991.

Sun et al., "Reactively Sputtered Ti-Si-N Films I: Physical Properties", J. Appl. Phys., vol. 81 No. 2 (Jan. 15, 1997), pp. 656-663.

Sun et al., "Reactively Sputtered Ti-Si-N Films II: Diffusion Barriers for Al and Cu Metallizations on Si", J. Appl. Phys., vol. 81 No. 2 (Jan. 15, 1997), pp. 664-671.

Wong et al., "Barriers for Copper Interconnections", from the website of the Interconnect Focus Center at Stanford University (May 4, 1999).

Maex, K. et al, ED, Properties of Metal Silicides, pp. 97-102, Published by Inspec, London, England, 1992.

Rogl, P, et al, Phase Diagrams of Ternary Boron Nitride and Silicon Nitride Systems, pp. 1-2, 6-7, 18-19, 32-37, 76-78, 85-87, 97-100, 103-106, 113-120, 125-130, 133-134, 144-157, 169-171, 175-177, 180-186, 195-199, 205-209, 215-218' Published by ASM International, Materials Park, Ohio, 1992.

* cited by examiner

MEMS WITH FLEXIBLE PORTIONS MADE OF NOVEL MATERIALS

This application is a continuation-in-part of U.S. application Ser. No. 09/910,537 to Reid filed Jul. 20, 2001, which claims priority from U.S. provisional application No. 60/228,007 to Reid filed Aug. 23, 2000. This application also claims priority from U.S. provisional application No. 60/300,533 to Reid filed Jun. 23, 2001.

BACKGROUND

1. Field of Invention

The present invention relates in general to MEMS devices, and in particular to movable micromirrors and micromirror arrays for direct-view and projection displays. U.S. Pat. Nos. 5,835,256 and 6,046,840 to Huibers, and U.S. patent application Ser. No. 09/617,419 to Huibers et al., the subject matter of each being incorporated herein by reference, disclose micro-electromechanical devices (MEMS) for steering light beams, such as in an optical switch, and/or for forming a display (e.g. a projection display). A common feature is a mirror element which is movable so as to deflect light through different angles, depending upon the mirror element's tilt angle. In one type of conventional direct view or projection display system, an array of reflective mirror elements are provided for producing an image.

2. Summary of the Invention

In the present invention, MEMS devices are provided that are capable of movement due to a flexible portion formed of a transition metal nitride. The MEMS devices can be any device, such as accelerometers, DC relay and RF switches, optical cross connects and optical switches, microlenses, reflectors and beam splitters, filters, oscillators and antenna system components, variable capacitors and inductors, switched banks of filters, resonant comb-drives and resonant beams, and micromirror arrays for direct view and projection displays. The flexible portion (e.g. the hinge of the mirror in the MEMS example herein) is preferably formed by sputtering a metal target in nitrogen ambient so as to result in a sputtered transition metal nitride hinge. It is also possible to form other parts of the MEMS device (e.g. structural parts that do not flex) out of the transition metal nitride.

DETAILED DESCRIPTION

Micromechanical Structure Fabrication:

Processes for microfabricating a MEMS device such as a movable micromirror and mirror array are disclosed in U.S. Pat. Nos. 5,835,256 and 6,046,840 both to Huibers, the subject matter of each being incorporated herein by reference. A similar process for forming MEMS movable elements (e.g. mirrors) on a wafer substrate (e.g. a light transmissive substrate or a substrate comprising CMOS or other circuitry) is illustrated in FIGS. 1 to 4. By "light transmissive", it is meant that the material will be transmissive to light at least in operation of the device (The material could temporarily have a light blocking layer on it to improve the ability to handle the substrate during manufacture, or a partial light blocking layer for decreasing light scatter during use. Regardless, a portion of the substrate, for visible light applications, is preferably transmissive to visible light during use so that light can pass into the device, be reflected by the mirrors, and pass back out of the device. Of course, not all embodiments will use a light transmissive substrate). By "wafer" it is meant any substrate on which multiple microstructures or microstructure arrays are to be formed and which allows for being divided into dies, each die having one or more microstructures thereon. Though not in every situation, often each die is one device or product to be packaged and sold separately. Forming multiple "products" or dies on a larger substrate or wafer allows for lower and faster manufacturing costs as compared to forming each die separately. Of course the wafers can be any size or shape, though it is preferred that the wafers be the conventional round or substantially round wafers (e.g. 4", 6", 8" or 12" in diameter) so as to allow for manufacture in a standard foundry.

Figure 1A:
FIGS. 1A to 1E illustrate one method for forming micromirrors.

FIGS. 1A to 1D show a manufacturing process for a micromechanical mirror structure. As can be seen in FIG. 1A, a substrate 10 such as glass (e.g. Corning 1737F), quartz, Pyrex™, sapphire, (or silicon alone or with circuitry thereon) etc. is provided. The cross section of FIGS. 1A–D is taken along line 1—1 of FIG. 2. An optional block layer on the glass surface (not shown) can be provided to block light (incident through the light transmissive substrate during use) from reflecting off of the hinge and potentially causing diffraction and lowering the contrast ratio (if the substrate is transparent).

Figure 1B:
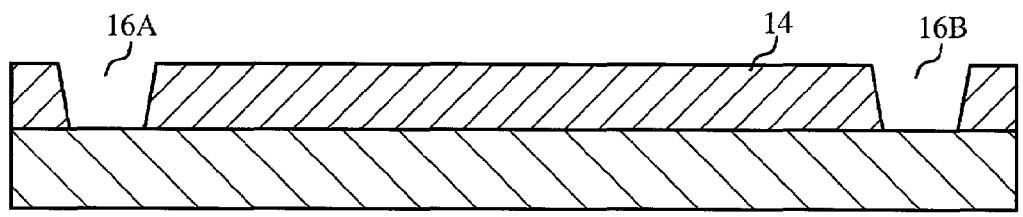

As can be seen in FIG. 1B, a sacrificial layer 14, such as amorphous silicon, is deposited. The thickness of the sacrificial layer can be wide ranging depending upon the movable element/mirror size and desired tilt angle, though a thickness of from 500 Å to 50,000 Å, preferably around 5000 Å is preferred. Alternatively the sacrificial layer could be polysilicon, silicon nitride, silicon dioxide, polyimide or other organic material, etc. depending upon the materials selected for the structural layers. A lithography step followed by a sacrificial layer etch forms holes 16$a,b$ in the sacrificial silicon, which can be any suitable size, though preferably having a diameter of from 0.1 to 1.5 um, more preferably around 0.7+/−0.25 um. The etching is performed down to the glass/quartz substrate or down to the block layer if present. Preferably if the glass/quartz layer is etched, it is in an amount less than 2000 Å.

Figure 1C:
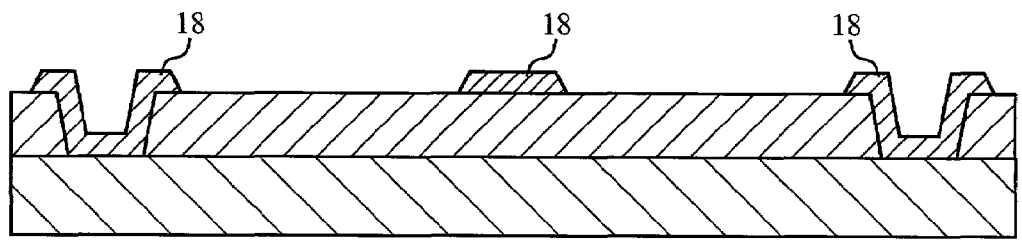

At this point, as can be seen in FIG. 1C, a first layer 18 is deposited by chemical vapor deposition (or sputtering). The material can be silicon nitride or silicon oxide deposited by LPCVD or PECVD, however polysilicon, silicon carbide or an organic compound could be deposited at this point (of course the sacrificial layer and etchant should be adapted to the material used). Though this layer need not be flexible (as it is for the mirror structure rather than mirror hinge), the transition metal nitride of the present invention (to be discussed further hereinbelow) could also be used for this first layer. The thickness of this first layer can vary depending upon the movable element size and desired amount of stiffness of the first layer can vary depending upon the movable element size and desired amount of stiffness of the element, however in one embodiment the layer has a thickness of from 100 to 3200 Å, more preferably around 1100 Å. The first layer undergoes lithography and etching so as to form gaps in areas corresponding to the future placement of the movable element hinges.

Figure 1D:
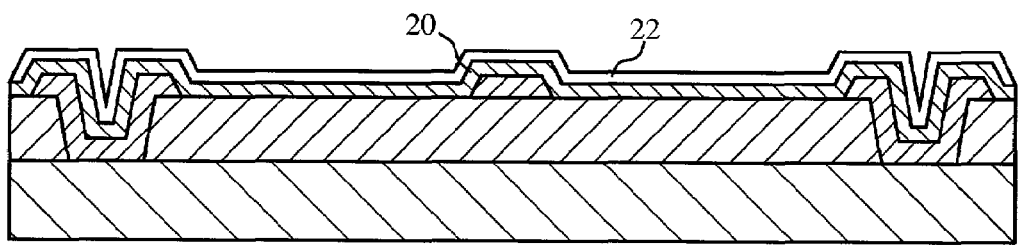
Figure 1E:
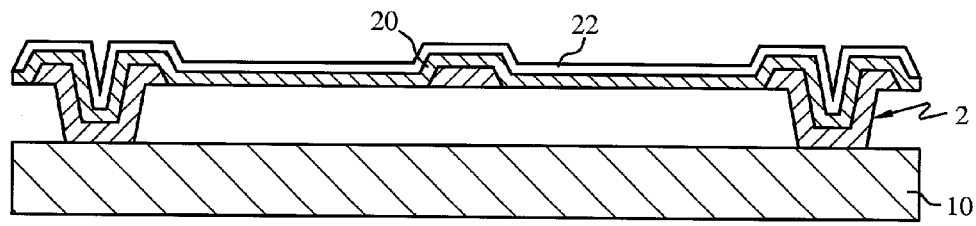
Figure 2:
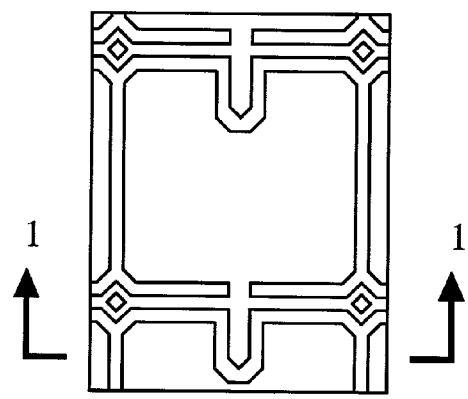
FIG. 2 is a top view of a micromirror showing line 1—1 for taking the cross section for FIGS. 1A to 1E.
Figure 3A:
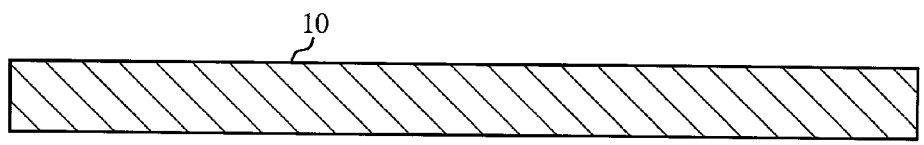
FIGS. 3A to 3E illustrate the same method as in FIGS. 1A to 1D but taken along a different cross section.
Figure 3B:
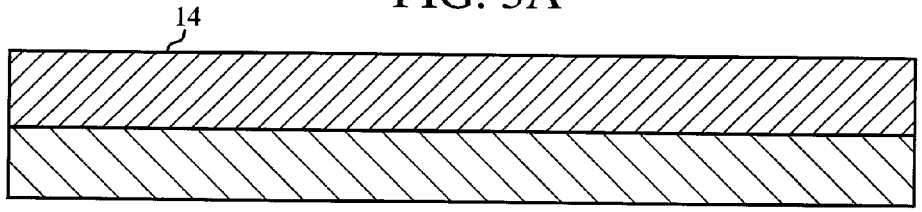
Figure 3C:
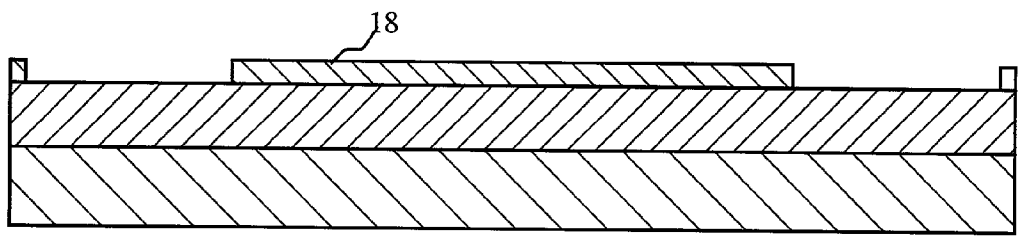
Figure 3D:
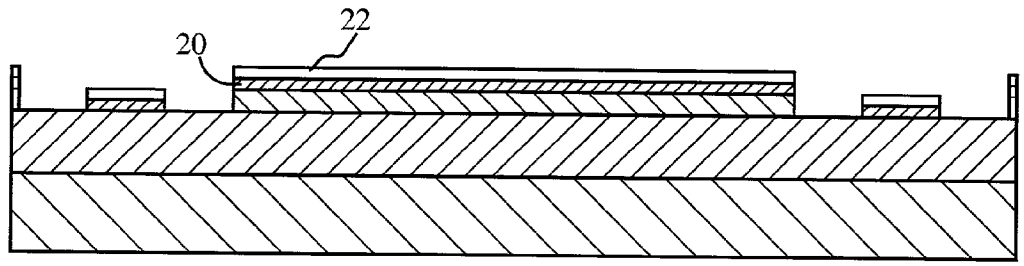
Figure 3E:
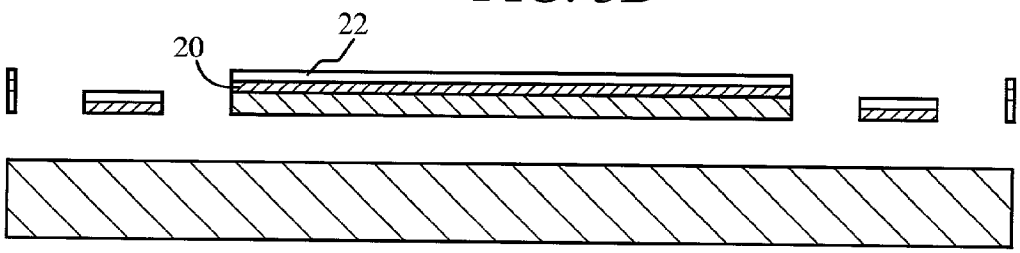
Figure 4:
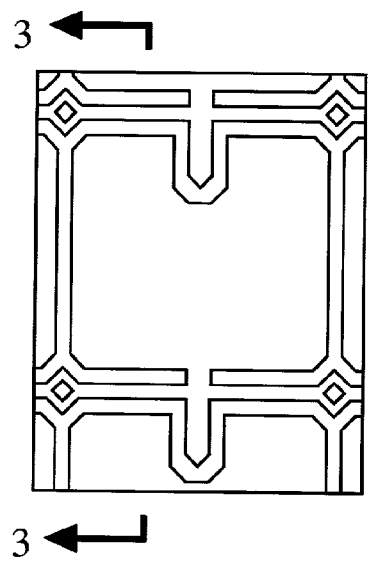
FIG. 4 is a top view of a mirror showing line 3—3 for taking the cross section for FIGS. 3A to 3E.

A second layer 20 is deposited as can be seen in FIG. 1D. The material for the second layer is a transition metal nitride, preferably deposited by sputtering. The thickness of the second layer can be greater or less than the first, depending upon the stiffness of the movable element, the flexibility of the hinge desired, the material used, etc. In one embodiment the second layer has a thickness of from 50 Å to 2100 Å, and preferably around 500 Å.

In the embodiment illustrated in FIGS. 1A to 1D, both the first and second layers are deposited in the area defining the movable (mirror) element, whereas the second layer, in the absence of the first layer, is deposited in the area of the hinge. However, it is also possible for the first and second layers to be deposited in the area of the movable element, with the first layer, but not the second, deposited in the area of the hinge. Depending upon a number of factors, including desired deflection distance, and dimensions of the hinge, the same layers (e.g. both first and second layers) can define both the hinge and mirror element. It is also not necessary to have both the first and second layers, in which case a single layer defining the hinge and movable element would be deposited as a transition metal nitride, preferably by sputtering.

It should be noted that if a single layer were to be provided in place of the two layers described above, the area forming the hinge could be partially etched to lower the thickness in this area and increase the flexibility of the resulting hinge. It is also possible to use more than two layers to produce a laminate movable element, which can be desirable particularly when the size of the movable element is increased such as for switching light beams in an optical switch. The materials for such layer or layers could also comprise alloys of metals and dielectrics or compounds of metals and nitrogen, oxygen or carbon (particularly the transition metals). Some of these alternative materials are disclosed in U.S. provisional patent application No. 60/228,007, the subject matter of which is incorporated herein by reference.

As also seen in FIG. 1D, a reflective layer 22 is deposited. Depending upon the reflectivity of the sputtered transition metal nitride, an additional reflective layer may not be needed. The reflective material can be gold, aluminum or other metal, or an alloy of more than one metal though it is preferably aluminum deposited by PVD. The thickness of the metal layer can be from 50 to 2000 Å, preferably around 500 Å. An optional metal passivation layer (not shown) can be added, e.g. a 10 to 1100 Å silicon oxide layer deposited by PECVD. Then, the photoresist patterning on the metal layer is followed by etching through the metal layer with a suitable metal etchant. In the case of an aluminum layer, a chlorine (or bromine) chemistry can be used (e.g. a plasma/RIE etch with $Cl_2$ and/or $BCl_3$ (or Cl2, CCl4, Br2, $CBr_4$, etc.) with an optional preferably inert diluent such as Ar and/or He). It should be noted that the reflective layer need not be deposited last, but rather could be deposited directly upon the sacrificial layer 14, between other layers defining the mirror element, or as the only layer defining the mirror element. However, in some processes it may be desirable to deposit a metal layer after a more insulating layer due to the higher temperature at which many dielectrics are deposited.

The first and second layers (or a single layer) can be etched subsequent to the reflective layer with known etchants or combinations of etchants (depending upon the material used and level of isotropy desired). For example, if the first or second layer is silicon or a silicon compound, such layer can be etched with a chlorine chemistry or a fluorine (or other halide) chemistry (e.g. a plasma/RIE etch with $F_2$, $CF_4$, $CHF_3$, $C_3F_8$, $CH_2F_2$, $C_2F_6$, $SF_6$, etc. or more likely combinations of the above or with additional gases, such as $CF_4/H_2$, $SF_6/Cl_2$, or gases using more than one etching species such as $CF_2Cl_2$, all possibly with one or more optional inert diluents). The layer or layers that comprise the transition metal nitride, can be etched with any suitable etchant, such as with a chlorine chemistry as above for the reflective layer. Of course, if different materials are used for the first layer and the second layer, then a different etchant can be employed for etching each layer. Alternatively, the reflective layer can be deposited before the first and second layer and then patterning either independently or with the first or with the second layer.

FIGS. 3A to 3D illustrate the same process taken along a different cross section (cross section 3—3 in FIG. 4) and show the sacrificial layer 14 deposited on the light transmissive substrate 10, followed by layers 18, 20 and the metal layer 22. The cross sections in FIGS. 1A to 1D and 3A to 3D are taken along substantially square mirrors in FIGS. 2 and 4 respectively. Though PVD and CVD are referred to above, other thin film deposition methods could be used for depositing the layers (PVD is preferred for the transition metal nitride layer), including spin-on, anodization, oxidation, electroplating and evaporation.

After forming the microstructures as in FIGS. 1 to 4 on the first wafer, it is preferable to remove the sacrificial layer so as to release the microstructures (in this case micromirrors). The release is described in more detail hereinbelow. This release can be performed at the die level, though it is preferred to perform the release at the wafer level. FIGS. 1E and 3E show the microstructures in their released state. As can be seen in FIG. 1E, posts 2 hold the released microstructure on substrate 10.

Figure 5:
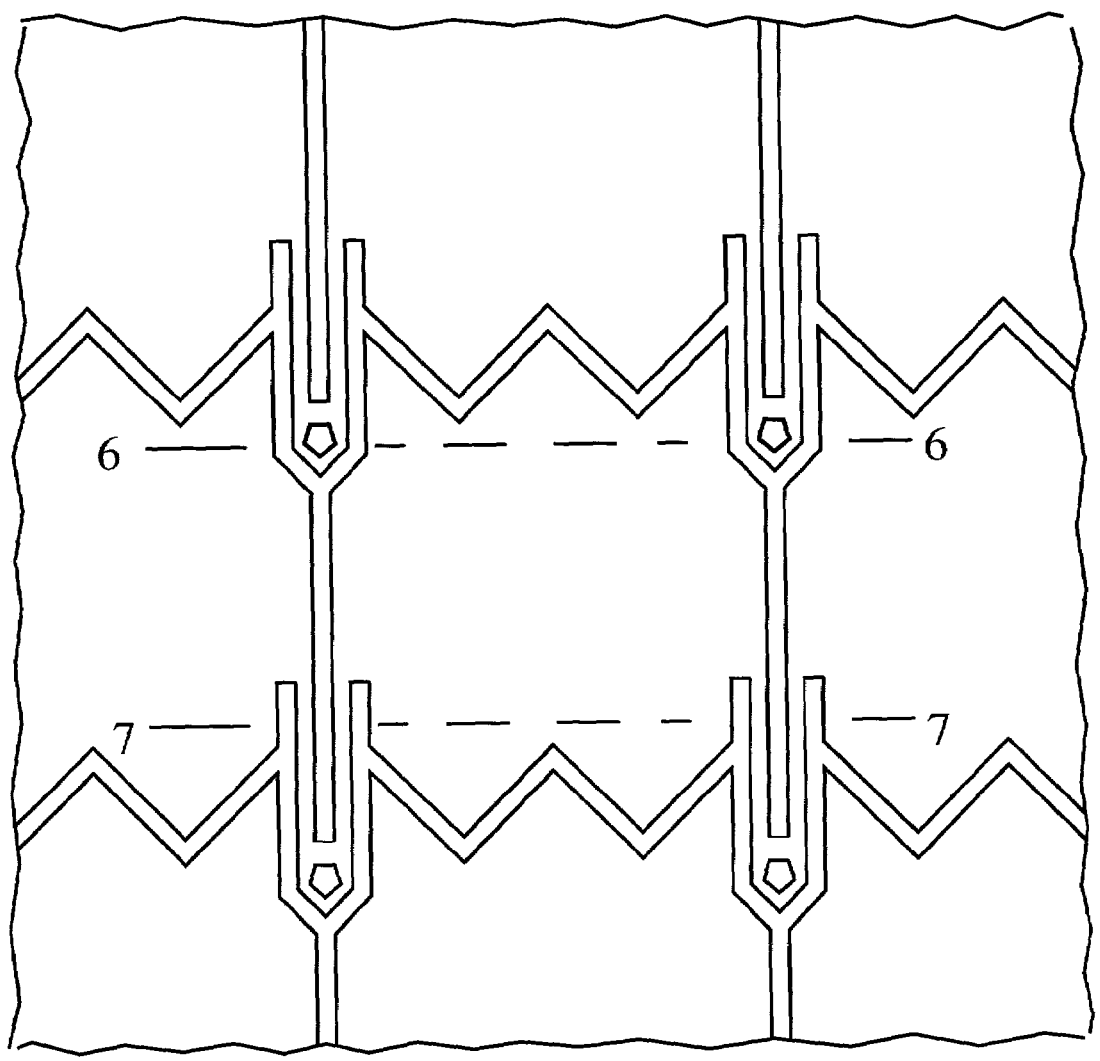
FIG. 5 is an illustration of a second embodiment of a micromirror in the present invention.

An alternate embodiment to that illustrated in FIGS. 1 to 4, are illustrated in FIGS. 5 to 7. As can be seen in FIG. 5, the mirror formed is not square. The micromirrors of the present invention need not be square but can have other shapes that may decrease diffraction and increase the contrast ratio, depending upon the position of the light source. Such mirrors are disclosed in U.S. provisional patent application No. 60/229,246 to Ilkov et al. filed Aug. 30, 2000, and U.S. patent application Ser. No. 09/732,445 to Ilkov et al. filed Dec. 7, 2000, the subject matter of each being incorporated herein by reference. Also, the mirror hinges can be flexure hinges as illustrated in the above-mentioned applications and as shown in FIG. 5 of the present application.

Figure 6A:
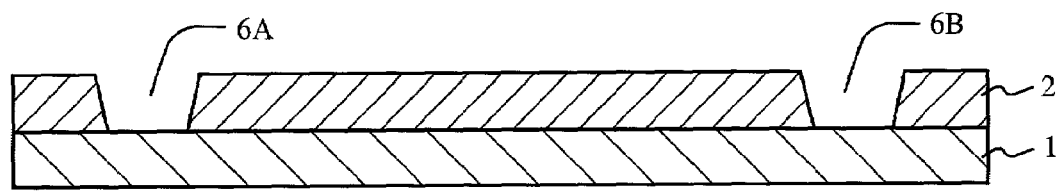
FIGS. 6A to 6C are cross sectional views of a method of making the micromirrors of FIG. 5, taken along line 6—6 in FIG. 5.
Figure 6B:
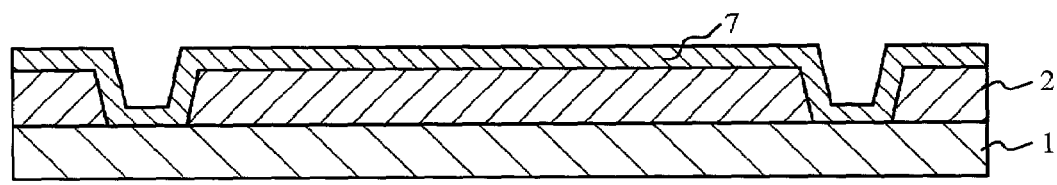
Figure 6C:
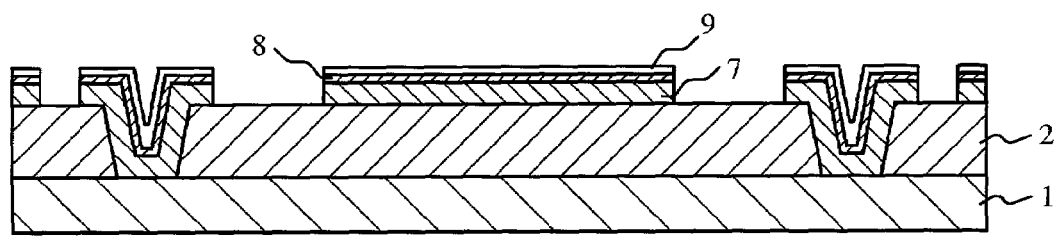

FIGS. 6A to 6C are cross sections taken along line 6—6 of FIG. 5. As can be seen in FIG. 6A, a substrate 1 is provided. A sacrificial layer 2 is deposited thereon and patterned so as to form holes 6A, 6B. The sacrificial material can be any suitable sacrificial material known in the art, such as amorphous silicon, silicon nitride, silicon oxynitride, silicon dioxide, PSG, amorphous silicon, etc. On layer 2 is deposited a micromechanical structural layer 7 (FIG. 6B) of a material different than that of the sacrificial layer (e.g. polysilicon if the sacrificial layer is silicon dioxide, silicon nitride if the sacrificial layer is amorphous silicon or polyimide, etc.). As can be seen in FIG. 6C, an additional structural layer 8 is deposited (after removing part of layer 7 in the hinge areas—not evident in this cross section), followed by depositing a reflective layer 9 (e.g. a metal such as Al, Ag, Au etc.). Layers 2, 7, 8 and 9 can be deposited by any known methods depending upon the material (spin-on for an organic material such as polyimide, chemical vapor deposition or sputtering for silicon or silicon compounds, sputtering for metal, etc.) and/or as disclosed herein with respect to the other figures. Finally, as illustrated in FIG. 6C, layers 7 to 9 are patterned by depositing and patterning photoresist followed by etching with a suitable etchant selected for the material(s) being etched (e.g. chlorine chemistry for a metal layer, hydrocarbon or fluorocarbon (or SF6) plasma for silicon or silicon compound layers, etc.). Not shown is the final removal of the sacrificial layer 2, discussed further herein below.

Figure 7A:
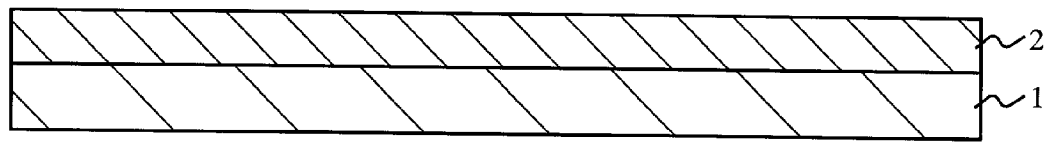
FIGS. 7A to 7C are cross sectional views of the method illustrated in FIGS. 6A to 6C, taken along line 7—7 in FIG. 5.
Figure 7B:
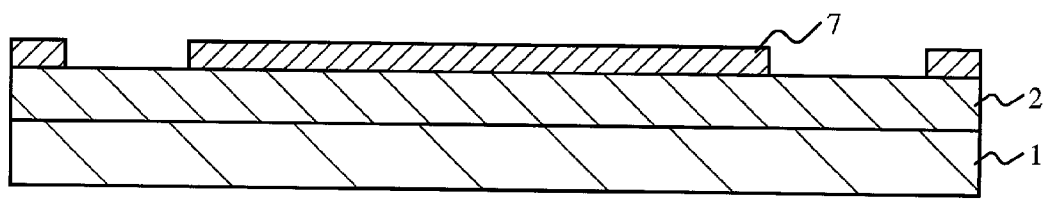
Figure 7C:
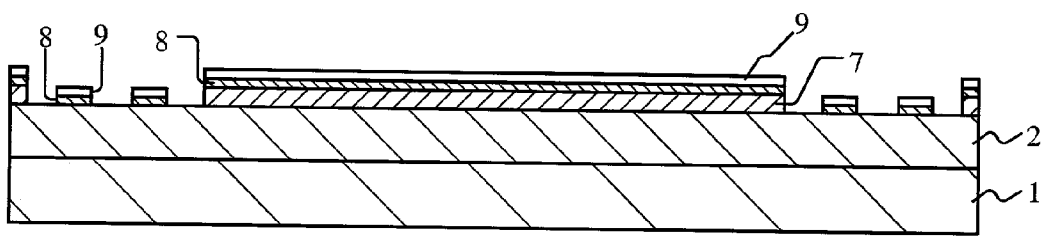

FIGS. 7A to 7C illustrate the same process as in FIGS. 6A to 6C, but are cross sectional views taken along line 7—7 of FIG. 5. As can be seen in FIG. 7A, the sacrificial layer 2 is deposited on substrate 1, followed by, in FIG. 7B, depositing layer 7. After deposition of layer 7, portions are removed (see gaps in layer 7 in FIG. 7B). This can be performed with a chlorine, chlorine compound, hydrocarbon, fluorocarbon or other known plasma etch selected based on the composition of layer 7. Then, as can be seen in FIG. 7C, layers 8 and 9 are deposited over all areas (not shown) followed by patterning to form hinges in the gaps in layer 7 and a corresponding reflective movable mirror element. The hinges, therefore, are made of layers 8 and 9 (e.g. a silicon or silicon compound layer and a metal layer) and the mirror area is formed of layers 7 to 9. Of course there are many variations to the above, such as putting the metal layer down first, forming the hinges or the entire device from a silicon compound-metal alloy (such as in application No. 60/228, 007 mentioned above), or using a single silicon or silicon compound layer and a single metal layer.

Figure 8A:
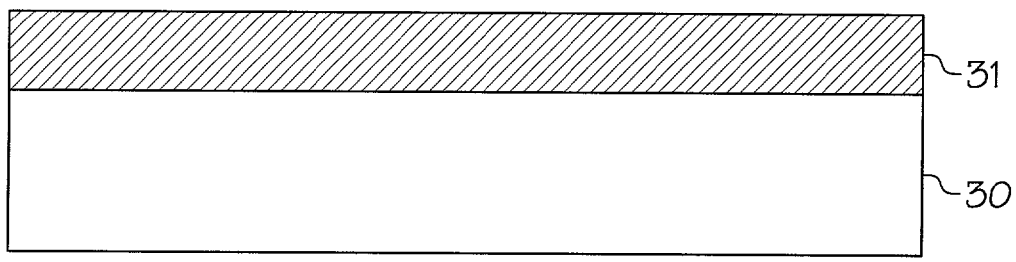
FIGS. 8A to 8J are cross sectional views of an additional method of making a micromirror of the present invention.
Figure 8B:
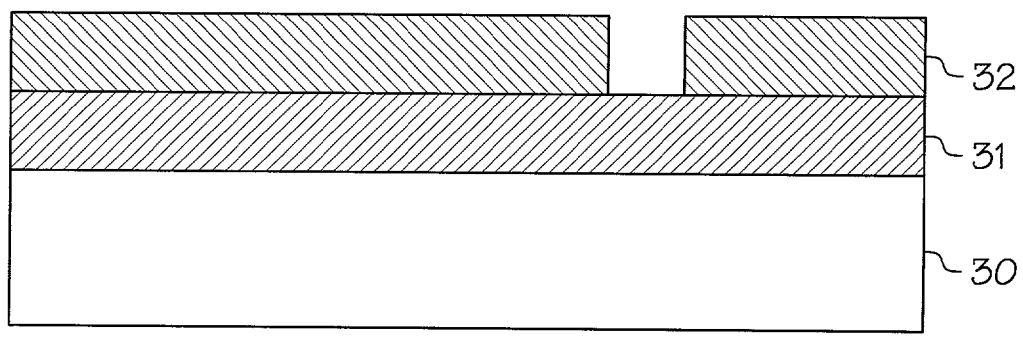
Figure 8C:
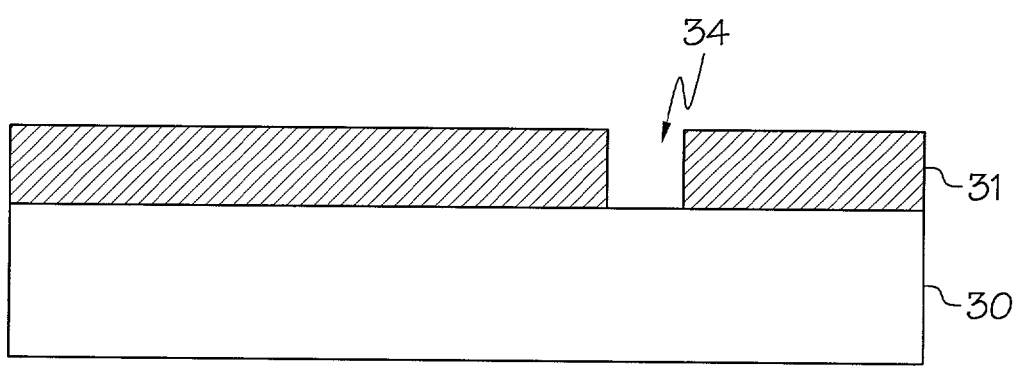
Figure 8D:
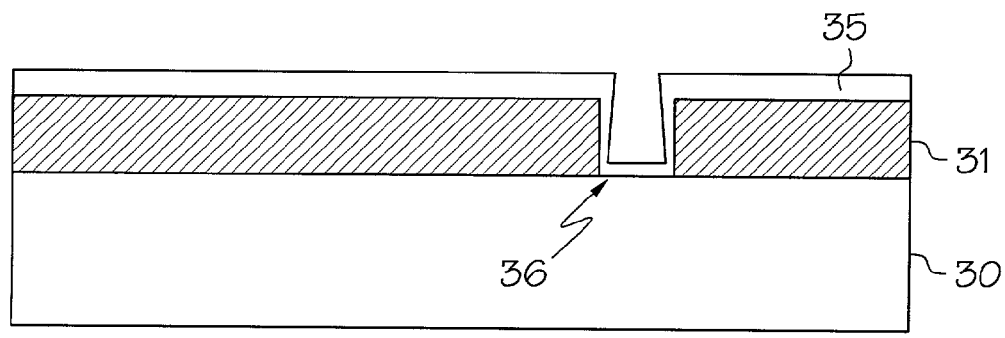

A further aspect of the invention is illustrated in FIGS. 8A to 8J. As can be seen in FIG. 8A, a transparent substrate 30 has deposited thereon a sacrificial material 31. As with making any MEMS device, a wide variety of sacrificial materials can be used, including those materials mentioned hereinabove. If the sacrificial material is not directly patternable, then a photoresist layer 32 is added and developed to form one or more apertures (FIG. 8B). Then, as can be seen in FIG. 8C, apertures are etched into the sacrificial material 31 and the photoresist is removed. As can be seen in FIG. 8D, a conductive layer 35 is deposited that will ultimately form at least the flexible portions for the MEMS device (in this example a micromirror structure). The conductive layer 35 can also form the posts 36 for attaching the micromirror to the substrate, or even all or part of the micromirror body. The conductive layer 35 in a preferred embodiment of the invention is a metal nitride, preferably a transition metal nitride, as will be discussed further hereinbelow. The conductive layer could also be a pure metal or metal alloy (sputtered) or a metal deposited by sputtering or electroplating with another metal implanted therein to increase stiffness and decrease fatigue. The conductive layer 35 could be a plurality of conductive layers, or one conductive layer among many other types of layers (structural dielectric layers, reflective layers, anti-stiction layers, etc.).

Figure 8E:
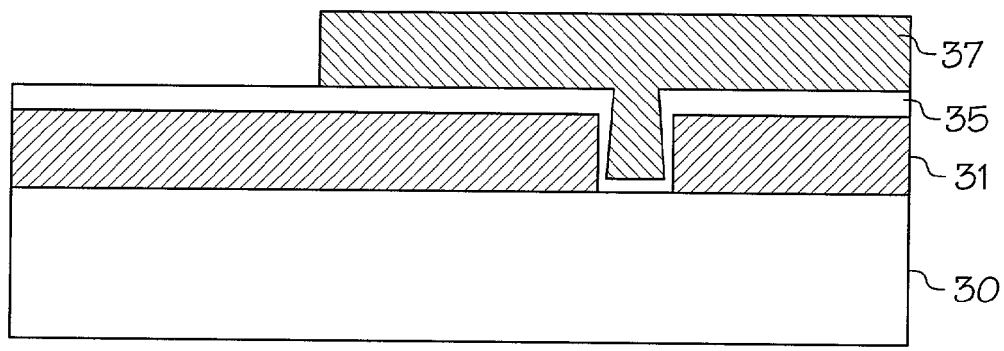
Figure 8F:
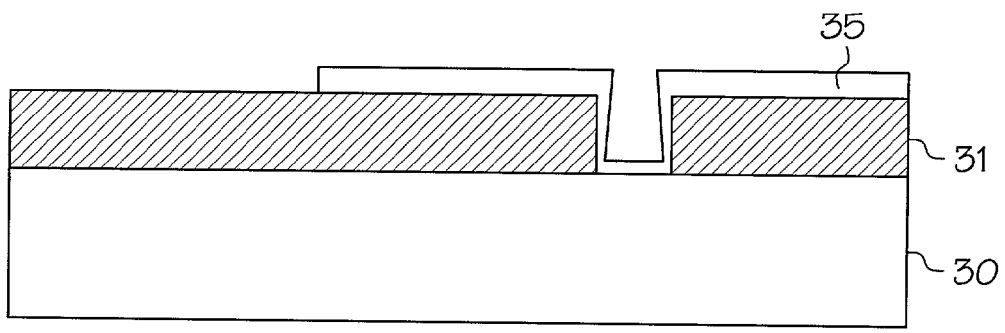
Figure 8G:
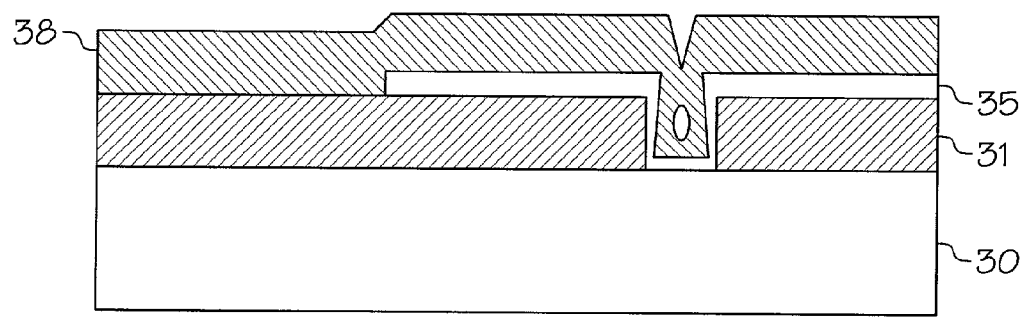
Figure 8H:
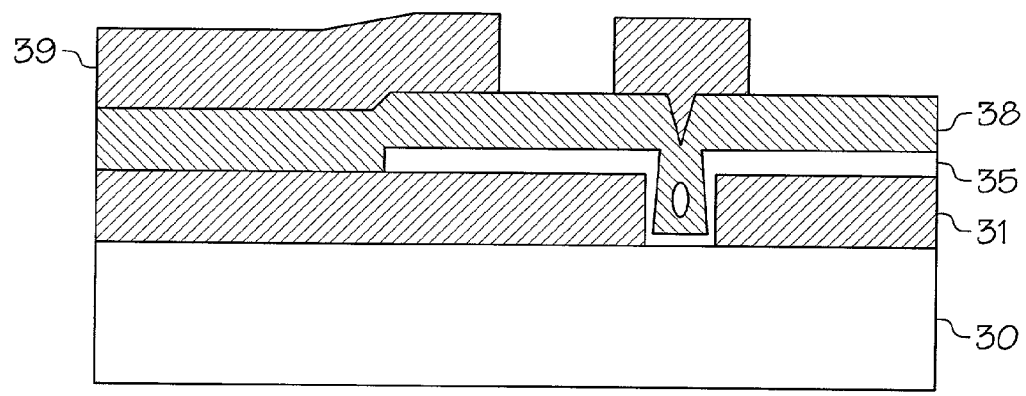
Figure 8I:
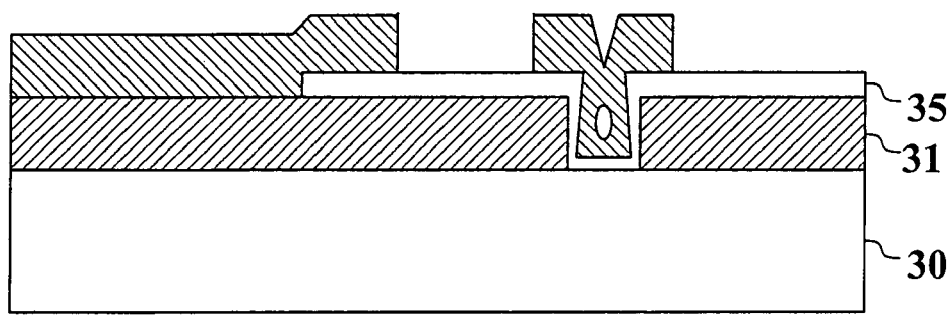
Figure 8J:
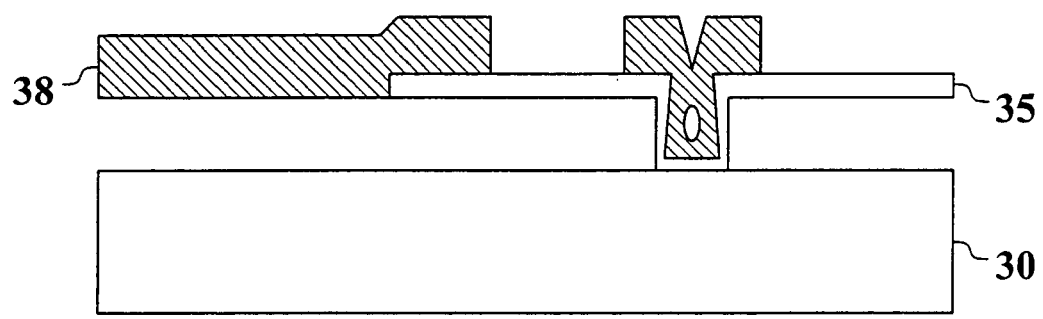

FIG. 8E shows the addition of photoresist (patterned) followed by etching of a portion of the conductive layer(s) and removal of the photoresist (FIG. 8F). Then, as can be seen in FIG. 8G, mirror structural material layer 38 is deposited. The material can be conductive or insulating and can be a plurality of layers. If the material is a single layer, it is preferably reflective (e.g., an aluminum or gold layer or alloy layer). Then, as can be seen in FIG. 8H, photoresist 39 is added and developed followed by (FIG. 8I) etching/removing portions of the layer 38 (such as in the area of the parts that will flex in operation). Finally, as can be seen in FIG. 8J, the sacrificial layer is removed to release the MEMS device so as to be free standing on the substrate. Though the above example is shown as being on a light transmissive substrate, the substrate could be a circuit substrate with the MEMS device formed monolithically on the circuit substrate.

Also, though the hinge of each mirror can be formed in the same plane as the mirror element (and/or formed as part of the same deposition step) as set forth above, they can also be formed separated from and parallel to the mirror element in a different plane and as part of a separate processing step. This superimposed type of hinge is disclosed in FIGS. 8 and 9 of the previously-mentioned U.S. Pat. No. 6,046,840, and in more detail in U.S. patent application "A Deflectable Spatial Light Modulator Having Superimposed Hinge and Deflectable Element" to Huibers et al. filed Aug. layer as in the Figures, or two (or more) sacrificial layers as for the superimposed hinge, such sacrificial layers are removed as will be discussed below, with a preferably isotropic etchant. This "release" of the mirrors can be performed immediately following the above described steps, or after shipment from the foundry at the place of assembly.

Though the MEMS elements can be formed monolithically with circuitry on a common substrate as mentioned elsewhere herein, in the preferred embodiment of the invention, the MEMS elements (here micromirrors) are formed on a separate substrate than the circuitry and electrodes for actuating the micromirrors. The second or "lower" substrate (the backplane) die contains a large array of electrodes on a top metal layer of the die. Each electrode electrostatically controls one pixel (one micromirror on the upper optically transmissive substrate) of the microdisplay. The voltage on each electrode on the surface of the backplane determines whether its corresponding microdisplay pixel is optically 'on' or 'off,' forming a visible image on the microdisplay. Details of the backplane and methods for producing a pulse-width-modulated grayscale or color image are disclosed in U.S. patent application Ser. No. 09/564,069 to Richards, the subject matter of which is incorporated herein by reference.

The display pixels themselves, in a preferred embodiment, are binary, always either fully 'on' or fully 'off,' and so the backplane design is purely digital. Though the micromirrors could be operated in analog mode, no analog capability is necessary. For ease of system design, the backplane's I/O and control logic preferably run at a voltage compatible with standard logic levels, e.g. 5V or 3.3V. To maximize the voltage available to drive the pixels, the backplane's array circuitry may run from a separate supply, preferably at a higher voltage.

One embodiment of the backplane can be fabricated in a foundry 5V logic process. The mirror electrodes can run at 0–5V or as high above 5V as reliability allows. The backplane could also be fabricated in a higher-voltage process such as a foundry Flash process using that process's high-voltage devices. The backplane could also be constructed in a high-voltage process with larger-geometry transistors capable of tolerating 12V or more. A higher voltage backplane can produce an electrode voltage swing significantly higher than the 5–7V that the lower voltage backplane provides, and thus actuate the pixels more robustly.

In digital mode, it is possible to set each electrode to either state (on/off), and have that state persist until the state of the electrode is written again. A RAM-like structure, with one bit per pixel is one architecture that accomplishes this. One example is an SRAM-based pixel cell. Alternate well-known storage elements such as latches or DRAM (pass transistor plus capacitor) are also possible. If a dynamic storage element (e.g. a DRAM-like cell) is used, it is desirable that it be shielded from incident light which might otherwise cause leakage.

The perception of a grayscale or full-color image will be produced by modulating pixels rapidly on and off, for example according to the method in the above-mentioned U.S. patent application Ser. No. 09/564,069 to Richards. In order to support this, it is preferable that the backplane allows the array to be written in random-access fashion, though finer granularity than a row-at-a-time is generally not necessary.

It is desirable to minimize power consumption, primarily for thermal reasons. Decreasing electrical power dissipation will increase the optical/thermal power budget, allowing the microdisplay to tolerate the heat of more powerful lamps. Also, depending upon the way the microdisplay is assembled (wafer-to-wafer join+offset saw), it may be preferable for all I/O pads to be on one side of the die. To minimize the cost of the finished device it is desirable to minimize pin count. For example, multiplexing row address or other infrequently-used control signals onto the data bus can eliminate separate pins for these functions with a negligible throughput penalty (a few percent, e.g. one clock cycle for address information per row of data is acceptable). A data bus, a clock, and a small number of control signals (5 or less) are all that is necessary.

In use, the die will be illuminated with a 200 W or more arc lamp. The thermal and photocarrier effects of this may result in special layout efforts to make the metal layers as 'opaque' as possible over the active circuitry to reflect incident optical energy and minimize photocarrier and thermal effects. An on-chip PN diode could be included for measuring the temperature of the die.

In one embodiment the resolution is XGA, 1024×768 pixels, though other resolutions are possible. A pixel pitch of from 5 to 24 um is preferred (e.g. 14 um). The size of the electrode array itself is determined by the pixel pitch and resolution. A 14 um XGA device's pixel array will therefore be 14.336×10.752 mm.

Figure 9:
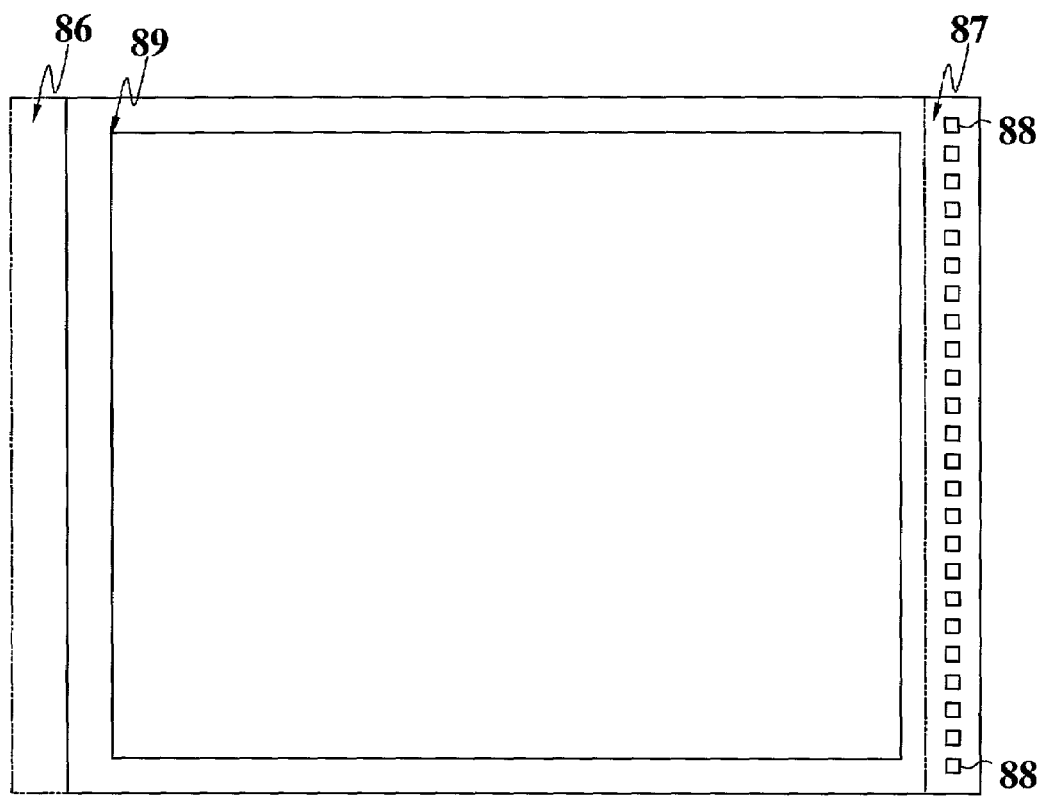
FIG. 9 is an illustration of the I/O pads and Si backplane for the embodiment of the invention using separate substrates.

As can be seen in FIG. 9, the I/O pads (88) can be placed along the right side of the die, as the die is viewed with pixel (0,0) (89 in FIG. 9) at the top left corner. Putting the pads on the 'short' (left/right) side (87) of the die is preferable due to the slightly reduced die size. The choice of whether the I/O should go on the left vs. right side of the die is of little importance since the display controller ASIC may support mirroring the displayed image in the horizontal axis, the vertical axis, or both. If it is desired to orient the display with the I/O on the left side, the image may simply be rotated 180 degrees by the external display controller. The electrode voltage during operation is, in the low state 0V and in the high state from 5 to 7 V (or 12V in the higher voltage design). In one embodiment the electrodes are metal squares, though other geometries are possible. Standard CMOS passivation stackup over the electrodes can be provided.

After the upper and lower substrates (wafers) are finished being processed (e.g. circuitry/electrodes on lower wafer, micromirrors on upper wafer), the upper and lower wafers are joined together. The assembly of the wafers and separation of the wafer assembly into individual dies is similar in many respects to the method for assembly of a liquid crystal device as disclosed in U.S. Pat. No. 5,963,289 to Stefanov et al, "Asymmetrical Scribe and Separation Method of Manufacturing Liquid Crystal Devices on Silicon Wafers", which is hereby incorporated by reference. The method for aligning and bonding (along with other assembly steps) the two substrates is further disclosed in U.S. patent application Ser. No. 09/732,445 to Ilkov et al., as are further details of the mirror shapes, this reference being incorporated herein by reference.

The hinges of the present invention can be provided connected to mirrors in an array for optical switching. The optical switch could be a typical switch with one or more fiber optic inputs and a plurality of fiber optic outputs, with one or more mirrors for switching the input light beam(s) to one of the outputs. The mirrors of the present invention could also be used as part of a beam scanner. These and other applications are disclosed in U.S. patent application Ser. No. 09/617,149 to Huibers et al., the subject matter of which being incorporated herein by reference.

Figure 10:
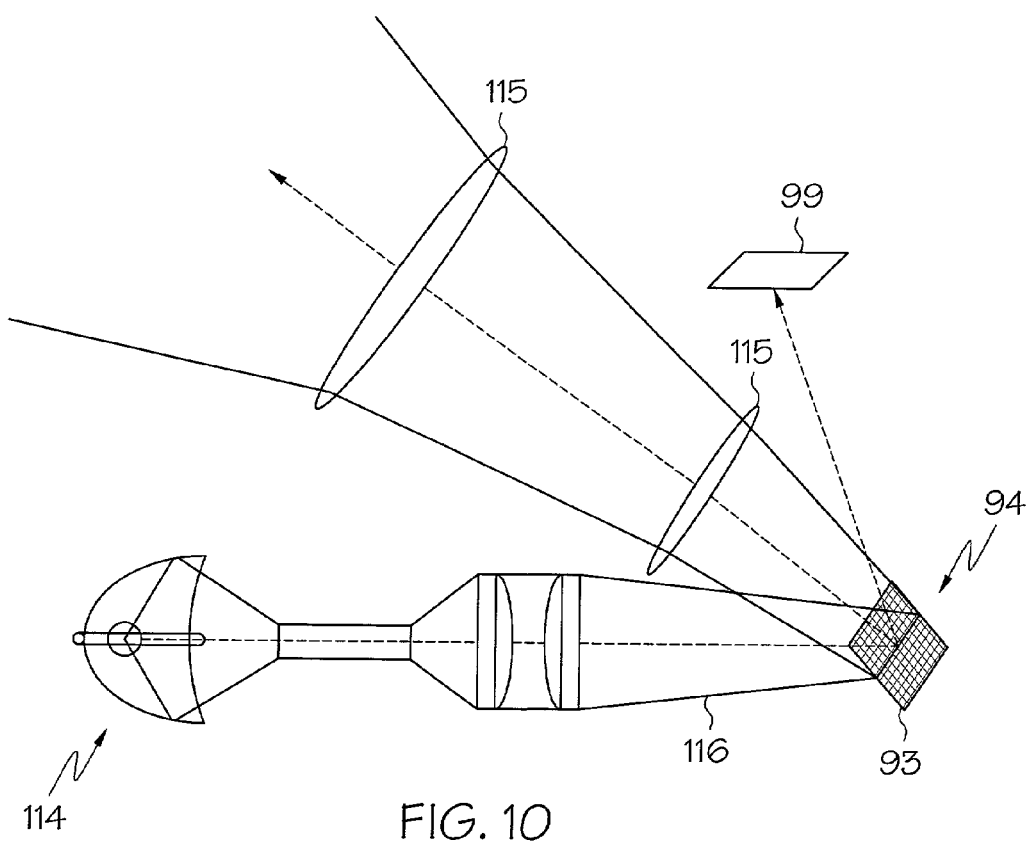
FIG. 10 is an illustration of one type of projection system for a micromirror array.

If, however, the mirrors (and hinges) of the present invention are for a projection display, there should be a suitable light source that illuminates the array and projects the image via projection optics to a target. The arrangement of light source and incident light beam to the array, and to each mirror, which allows for the improved contrast ratio in the present invention, can be seen in FIG. 10. As can be seen in FIG. 10, a light source 114 directs a beam of light 116 at a 90 degree angle to the leading side 93 of the active area of the array (the active area of the array illustrated as rectangle 94 in the figure). The active area 94 would typically have from 64,000 to about 2,000,000 pixels in a usually rectangular array such as illustrated in FIG. 10. The active area 94 reflects light (via on-state mirrors) through optics 115 to a target to form a corresponding rectangular image on the target (e.g. wall or screen). Of course, the array could be a shape other than rectangular and would result in a corresponding shape on the target (unless passed through a mask). Light from light source 114 reflects off of particular mirrors (those in the on-state) in the array, and passes through optics 115 (simplified as two lenses for clarity). Mirrors in their off-state (in a non-deflected "rest" state), direct light to area 99 in FIG. 10.

As mentioned above, the flexible part of the MEMS device can be formed of a transition metal nitride. The transition metal nitride layer is preferably formed by sputtering a transition metal target in nitrogen gas. Though the target could be a combination of more than one transition metal (or two transition metals in alloy form), it is preferred that the target comprise a single transition metal, or one (or more) transition metals and one or more metalloids (and, perhaps, minute quantities of impurities such as O, H, other transition metals, metalloids, etc., which are often present in various sputtering methods). In one embodiment, the target comprises at least one transition metal and at least one metalloid. In another embodiment, the target comprises a single transition metal without any other metals except perhaps as impurities or in trace amounts. In such a case, it is preferred that the transition metal of the target make up 90% or more of the target, preferably 98% or more. And, though nitrogen is the preferred gas for sputtering, small amounts of oxygen or hydrogen in the sputtering gas can result in small amounts of oxygen or hydrogen (or compounds thereof such as a transition metal oxide in small amounts) in the layer or structure being formed by the sputtering in the method of the present invention.

The sputtering or PVD (physical vapor deposition) can be performed in any of a number of known PVD systems, including dc glow-discharge sputtering systems, rf glow discharge sputtering systems, and magnetron sputtering systems. Commercially available examples include the Varia (3000 series) sputtering system, the Applied Materials Endura VHP PVD system, the Applied Materials Centura HP PVD system, and the MRC Eclipse Sputtering system. Other systems and methods are disclosed in the Handbook of Physical Vapor Deposition, D. M. Mattox, 1998, incorporated herein by reference.

The transition metals are those elements in the periodic table in columns 3 to 12 (1B to 8B), namely columns beginning with Sc, Ti, V, Cr, Mn, Fe, Co, Ni, Cu and Zn. Preferred are those elements in columns 3B, 4B, 5B, 6B and 7B—however late transition metals in columns 8B, 1B and 2B are also possible in the present invention. In one embodiment of the invention, a single transition metal is sputtered from a target in a nitrogen atmosphere to form a (single) transition metal nitride. It is also within the invention to provide a target with more than one transition metals (or a plurality of targets with different transition metals). In one embodiment of the invention, the target comprises at least one late transition metal—a single or multiple transition metals that each form nitrides when sputtered. The late transition metal target can also comprise one or more early transition metals and/or one or more metalloids (B, Si, Ge, As, Sb)—each forming nitrides during sputtering. It is also possible to use only metalloids (a single metalloid—other than Si—or more than one metalloid in the target), though having at least one transition metal is preferred in the present invention. For many late transition metal nitrides, the films will be predominantly ternary—at least in part (amorphous and/or nanophase), whereas binary nitride films (e.g. many nitrides of early transition metals) will often be polycrystalline, at least in part.

If a plurality of metals or metalloids is present in the MEMS structure, each need not be formed as a compound with nitrogen. It is within the invention that one transition metal or metalloid is in nitride form, and an additional metal or metalloid is present in element form. For example, a single transition metal nitride can be present in the MEMS structure along with an additional metal or metalloid in elemental form. Likewise, a metalloid nitride can be present in the MEMS structure along with an additional metal or metalloid in compound or elemental form. In a specific embodiment, the MEMS structure comprises a transition metal nitride and a metalloid nitride. In a yet further embodiment of the invention, the MEMS structure comprises at least two of: an early transition metal, a compound of a late transition metal, a late transition metal, a metalloid, and a compound of a metalloid.

Si and B are preferred metalloids, though any of the metalloids can be used in the present invention. Ti, V, Zr, Ta and W are preferred early transition metals, though any of the early or late transtion metals can be used in the present invention in accordance with the above. Some specific examples within the present invention include cobalt silicon nitride, platinum silicon nitride, nickel silicon nitride, chromium nitride, tantalum nitride, tantalum silicon nitride, tantalum oxynitride, vanadium nitride, titanium nitride, titanium silicon nitride, zirconium nitride, tungsten silicon nitride, tungsten nitride, tungsten silicon nitride, molybdenum nitride, molybdenum silicon nitride, chromium tungsten nitride, tungsten boron nitride, tungsten oxynitride, nickel nitride, titanium carbon nitride, iron aluminum nitride, iron tantalum nitride, iron nitride, indium nitride, hafnium nitride, molybdenum nitride and iron cobalt nitride. These are but a few examples that can be used for the MEMS structure (particularly the flexible portion of the MEMS device) as set forth herein.

Of course late transition metals will have a lower or metastable affinity for nitrogen during sputtering (they also will be less stiff, though can have an improved plasticity). Si can be added to the target so that the film formed resembles a late transition metal +SiNx (in one embodiment of the invention, two early transition metals and silicon are part of a target, whereas in another embodiment of the invention, one or more late transition metals and silicon are present in the target). Some of these types of films are disclosed in U.S. provision application No. 60/228,007 to Reid et al. filed Aug. 23, 2000, incorporated herein by reference. Also, near metalloids such as phosphorous and/or carbon can be added to the transition metal target so as to form transition metal-phosphonitrides and/or transition metal-carbonitrides. Oxygen is preferably not present in the sputtering atmosphere if electrically conductive films are desired—however, some transition metals form electrically conductive compounds with oxygen, e.g. Ru and In (which form RuO2 and In2O3) and some do not form oxides well or at all (Au, Pt, etc.)—therefore in some cases, depending upon the transition metal in the target (or in cases where it is not desired to have an electrically conductive film) oxygen in the sputtering atmosphere is not a problem and can even be desirable.

Many variations from the above describe examples are possible. For example, in place of sputtering the films as described above, it is also possible to deposit the films by chemical vapor deposition (e.g. PECVD or LPCVD). Also, though electrically conductive films are preferred in the present invention, electrically insulating films are also with the scope of the invention. And, electrically insulating films (e.g. many metal nitrides) can be formed with elemental metals or metalloids to improve conductivity if conductivity is desired.

The invention has been described in terms of specific embodiments. Nevertheless, persons familiar with the field will appreciate that many variations exist in light of the embodiments described herein.

I claim:

1. A MEMS device, comprising:
   a flexible portion formed of a) a first layer that comprises silicon nitride; and b) a second layer that comprises a nitride or oxynitride of at least one transition metal and a nitride or oxynitride of at least one metalloid or near metalloid.

2. The MEMS device of claim 1, wherein the transition metal is an early transition metal and the metalloid is boron.

3. The MEMS device of claim 1, wherein the transition metal is a late transition metal and the metalloid is boron or silicon.

4. The MEMS device of claim 1, wherein the flexible portion is a mirror or RF switch hinge.

5. The MEMS device of claim 4, wherein the mirror is a mirror in an optical switch or projection display.

6. The MEMS device of claim 1, wherein a flexible portion and a non-flexible portion are formed of the nitride of at least one transition metal, and a nitride of at least one metalloid.

7. The MEMS device of claim 1, wherein the flexible portion is formed of nitrides of more than one transition metal and at least one metalloid.

8. The MEMS device of claim 7, wherein the transition metals are selected from Mo, Ta, Ti, Cr and W, and the metalloid is selected from B, Si, Ge or As.

9. The MEMS device of claim 1, wherein the near metalloid is Al, C or P.

10. The MEMS device of claim 9, wherein the transition metal is Mo, Ta, Ti, Cr or W.

11. A MEMS device; comprising:
a flexible portion formed of a) a first layer that comprises silicon nitride; and b) a second layer that comprises one or more late transition metal nitrides or oxynitrides.

12. The MEMS device of claim 11, further comprising an early transition metal or metalloid in elemental or compound form.

13. The MEMS device of claim 12, wherein the early transition metal or metalloid is in compound form.

14. The MEMS device of claim 13, wherein the compound form is a nitride or oxynitride.

15. The MEMS device of claim 12, wherein the early transition metal or metalloid is selected from Ti, V, Cr, Zr, Nb, Mo, Ta, W, B, Si, Ge, Sb, or As.

16. The MEMS device of claim 12, wherein the late transition metal is from column 8B of the periodic table and wherein the metalloid is silicon.

17. The MEMS device of claim 11, wherein the late transition metal is Co, Ni, Cu, Zn, Pd, Ag or Pt.

18. The MEMS device of claim 11, further comprising a metal in elemental form.

19. A MEMS device; comprising:
a flexible portion formed of a) a first layer that comprises silicon nitride; and b) a second layer that comprises a single transition metal in nitride form, and an additional metal substantially in elemental form.

20. The MEMS device of claim 19, wherein the metal in elemental form is provided by implantation.

21. The MEMS device of claim 19, wherein the transition metal is an early transition metal, and the additional metal is a transition metal or metalloid.

22. The MEMS device of claim 21, wherein the early transition metal is selected from Y, Zr, V, Nb, Mo, Cr, Ta or W.

23. A MEMS device, comprising:
a flexible portion formed of a) a first layer that comprises silicon nitride; and b) a second layer that comprises at least one metalloid nitride or oxynitride and a transition metal, wherein the transition metal is in compound form and is a nitride or oxynitride.

24. The MEMS device of claim 23, further comprising an additional metalloid in elemental form.

25. The MEMS device of claim 23, wherein the metalloid is B, Si, Ge, As, or Sb.

26. The MEMS device of claim 23, wherein the transition metal is a late transition metal.

27. The MEMS device of claim 26, wherein the late transition metal is Co, Ni or Cu.

28. The MEMS device of claim 23, wherein the transition metal is an early transition metal.

29. The MEMS device of claim 28, wherein the early transition metal is Ti, Cr, Mo, Ta or W.

30. The MEMS device of claim 23, wherein the flexible portion is a hinge of a MEMS mirror, DC relay or RF switch.

* * * * *